Sept. 17, 1968 H. S. LEHMAN 3,402,081

METHOD FOR CONTROLLING THE ELECTRICAL CHARACTERISTICS OF A SEMICONDUCTOR SURFACE AND PRODUCT PRODUCED THEREBY

Filed June 30, 1965

INVENTOR
HERBERT S. LEHMAN
BY Harry M. Weiss
ATTORNEY

United States Patent Office 3,402,081

Patented Sept. 17, 1968

3,402,081

METHOD FOR CONTROLLING THE ELECTRICAL CHARACTERISTICS OF A SEMICONDUCTOR SURFACE AND PRODUCT PRODUCED THEREBY

Herbert S. Lehman, Poughkeepsie, N.Y., assignor to International Business Machines Corporation, Armonk, N.Y., a corporation of New York Filed June 30, 1965, Ser. No. 468,225
12 Claims. (Cl. 148—188)

ABSTRACT OF THE DISCLOSURE

A method for controlling the conductivity of a semiconductor surface in contact with an insulating layer that involves the application of an active metal layer to the surface of the insulating layer and followed by a heating procedure. The active metal is selected from the group consisting of aluminum, magnesium, titanium, chromium and silicon. Heat treatment is carried on for a period of time and at a temperature sufficient to vary the conductivity of the semiconductor surface region substantially directly under the active metal layer. It is possible to convert in a controllable fashion the surface of the semiconductor body to a desired conductivity depending on the heat treatment temperature and time.

Figure 1:
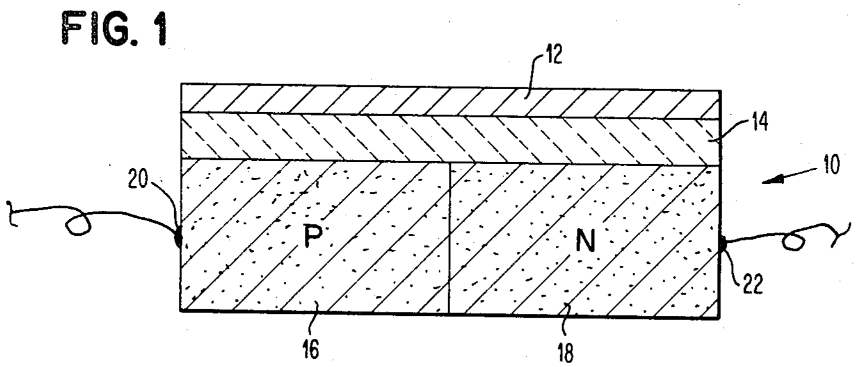

This invention relates generally to a method for controlling the electrical characteristics of a semiconductor surface and, more particularly, to a method for controlling the surface conductivity of a silicon body including the product produced thereby.

It is often necessary to form a channel of a desired type conductivity on the surface of a semiconductor body so as to electrically connect up regions of the same type conductivity such as for field effect devices, integrated circuits, etc.

Normally, a conductive channel of a desired type conductivity was created on the surface of a body of semiconductor material by diffusion techniques wherein the desired impurities necessary to form a channel of the desired type conductivity were formed at the surface of the semiconductor body. However, if an insulating layer was located on the semiconductor body, the prior technique usually required stripping off the insulating layer or opening holes therein and then diffusing impurity atoms into the surface of the exposed semiconductor body to form a conductive channel of a desired type conductivity. This was time consuming and expensive and, in addition, required the formation or restoration of the insulating layer on the semiconductor surface. Accordingly, it was considered desirable to form a conductive channel on the surface of a body of semiconductor material located beneath an insulating layer without the necessity of removing the entire insulating layer to expose the semiconductor surface for treatment or resorting to opening holes in the insulating layer to treat the exposed semiconductor surface.

Another technique for changing the type of conductivity of a semiconductor surface located beneath an insulating layer was that undertaken by Atalla and Tannenbaum as disclosed in the Bell System Technical Journal, volume 39, p. 933 of the 1960 edition. In this approach, the oxide or insulating layer formed on the semiconductor surface was grown at a very fast rate and at relatively low temperature thereby causing impurity atoms of one type impurity to pile up beneath the insulating layer while the impurity atoms of the opposite impurity were diffused into the insulating layer. Hence, due to the relative difference between the impurity atoms at the semiconductor surface, the resulting surface conductivity became the conductivity of the impurity atoms that were piled up at the semiconductor surface. One difficulty with this prior technique of changing the conductivity of a semiconductor surface located beneath an insulating layer was that once the conductivity was established for the semiconductor surface portion, after the reoxidation process, it was difficult to change the existing conductivity to the opposite type conductivity.

Accordingly, it was desirable to provide a method for controlling the surface conductivity of a semiconductor body encapsulated with an insulating layer so that the surface conductivity could be changed from one type to the opposite type, as desired.

It is an object of this invention to provide an improved method for controlling the surface conductivity of a body of semiconductor material.

It is a further object of this invention to provide an improved method for controlling the surface conductivity of a body of silicon.

It is a still further object of this invention to provide a method for controlling the surface conductivity of a body of silicon beneath an insulating layer of silicon dioxide formed thereon.

In accordance with a particular form of the invention, the method for controlling the surface conductivity of a semiconductor surface in contact with an insulating layer comprises applying an active metal to the surface of the insulating layer. Preferably, silicon is used as the semiconductor material, aluminum is used as the active metal, and the insulating layer is composed of silicon dioxide. Heat treatment is carried out for a period of time and at a temperature sufficient to vary the surface conductivity of the semiconductor surface. Using aluminum as the active metal, it is possible to convert in a controllable fashion, the surface of a P type silicon body to N type and then back to P type depending on heat treatment temperatures and time. Accordingly, the semiconductor surface conductivity of an oxide coated semiconductor body can be selected, as desired.

The foregoing and other objects, features and advantages of the invention will be apparent from the following more particular description of preferred embodiments of the invention, as illustrated in the accompanying drawings.

Figure 2:
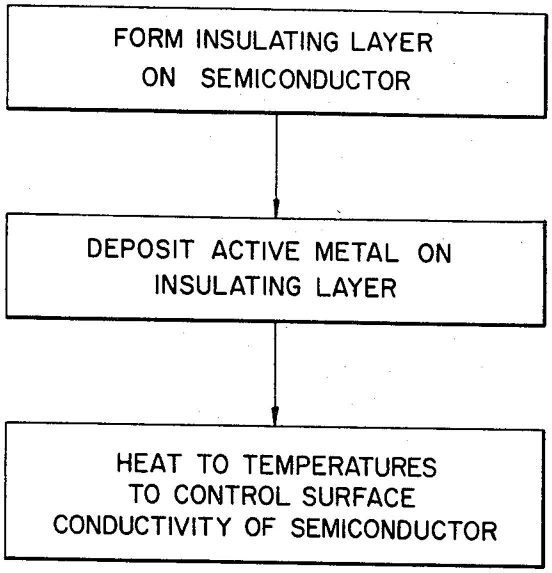

In the drawings:

FIG. 1 is a sectional view showing a P-N type semiconductor device having an insulating layer and a layer of active metal located on the insulating layer for controlling the surface conductivity of the semiconductor device; and FIG. 2 is a flow diagram illustrating the method of this invention.

Referring to FIG. 1, a semiconductor device is generally designated by reference numeral 10. An active metal 12 is deposited on an insulating layer 14 located on the semiconductor surface of a wafer having a P type region 16 and an N type region 18. Ohmic contacts 20 and 22 are respectively connected to regions 16 and 18. The formation of contacts 20 and 22 can be performed in a separate operation or in conjunction with the formation of the metal layer 12.

In one example, the semiconductor wafer was fabricated of one ohm-centimeter P-type silicon for the region 16 and 0.01 ohm-centimeter N-type silicon for the region 18. The silicon wafer was then subjected to thermal oxidation to form the silicon dioxide insulating layer 14. The active metal 10 was deposited on the $SiO_2$ layer 14 preferably by an evaporation process while keeping the silicon wafer at room temperature. The following Table I indicates the active metals used and the heat treatment necessary to cause changes in surface conductivity:

TABLE I

| Metal | Initial voltage | Degrees centigrade | | | | | | | |
|---|---|---|---|---|---|---|---|---|---|
| | | 200 | 300 | 400 | 450 | 500 | 550 | 600 | 700 |
| Al | 83 | 81 | 50 | 7 | −5 | −13 | −140 | −140 | 80 |
| Mg | 92 | 86 | 86 | 7 | −60 | −10 | 7 | 25 | ----- |
| Ti | 82 | 78 | 66 | 43 | −70 | −61 | 4 | 35 | 80 |
| Cr | 90 | 88 | 85 | 21 | −12 | −25 | −9 | 25 | 80 |
| Si | 90 | 77 | 60 | 25 | −16 | −30 | 0 | 20 | 80 |

The voltages indicated in the above table are those which have to be applied to the active metal 12 at room temperature after 15 minutes heat treatment in a nitrogen ambient at atmospheric pressure at the temperatures indicated to obtain a surface conductivity of approximately 10 $\mu$amperes. A back bias of approximately 25 volts was applied to the contacts 20 and 22. A negative voltage in the table indicates that the current across the surface of the P-type region 16 in contact with the insulating layer 14 was in excess of 10 $\mu$amperes thereby indicating that the surface conductivity of the P-type region 16 was of N-type conductivity created by a surface layer of negative changes. It is not completely understood why negative charges are formed at the semiconductor surface of the P-type region 16 and what type of negative charges are formed. However, one theory is that the active metal 12 reacts with the insulating layer 14 in some manner to cause the formation of the N-type surface conductivity on the P-type region 16.

Since the positive voltages in the above table indicate that the surface conductivity of the P-type region 16 is positive, the changes in voltages from positive to negative to positive indicates changes in the surface conductivity of the P-type region 16 from positive to negative to positive. Hence, control of the surface conductivity of the P-type region 16 is possible by heat treatment of the semiconductor wafer at a particular temperature for a sufficient period of time to create the desired conductivity change. The period of heat treatment was approximately 15 minutes to obtain the results shown in Table I, however, longer periods of heat treatment can be used in some applications and, correspondingly, shorter periods of heat treatment may also be found to be advantageous. However, the period of approximately 15 minutes was usually observed to be the minimum time period necessary to arrive at the changes in surface conductivity shown by the voltage changes of Table I.

The following Table II lists the leakage currents in milliamps at the semiconductor surface with no voltage applied to the active metal layer 12 and a back biased potential of 25 volts applied to the contacts 20 and 22:

TABLE II

| | Al | Mg | Ti | Cr | Si |
|---|---|---|---|---|---|
| Initial current | 0.00015 | 0.00014 | 0.00015 | 0.00011 | 0.00013 |
| 200° C | 0.00015 | .00014 | .00015 | .00011 | .00013 |
| 300° C | .00015 | .00015 | .00015 | .00011 | .00013 |
| 400° C | .00027 | .00035 | .00020 | .00015 | .00017 |
| 450° C | 0.011 | 5.3 | 5.7 | 0.009 | .007 |
| 500° C | 0.66 | 4.0 | 4.1 | 0.60 | .62 |
| 550° C | 10.2 | 0.007 | .007 | .020 | .020 |
| 600° C | 9.5 | 0.00068 | .00065 | .00070 | .00068 |
| 700° C | 0.00017 | ---------- | .00017 | .00016 | .00018 |

Here again the measurements were made at room temperature after a 15 minute heat treatment at the temperature indicated.

Referring to FIG. 2, a flow diagram is shown illustrating the method of this invention. Preferably, the active metal film or layer 12 was evaporated onto the insulating layer 14 through a metal mask while keeping the semiconductor wafer at room temperature to prevent the immediate formation of a conductive channel of N type conductivity on the surface of the P-type region 16. Although the device of FIG. 1 was heat treated in a nitrogen ambient at atmospheric pressure for a period of approximately fifteen minutes at increasing temperatures up to 700° C., the optimum temperature range for making significant changes in surface conductivity is between 400° and 600° C. and other relatively inert gases besides nitrogen can be used.

The five metals shown in Tables I and II are the active metals of this invention. These five metals were tested with Ag, Au, Cu, Zn, Pt, Pd, Ni, and Mo under the same conditions and, although all of the other metals tested showed some activity in affecting the surface conductivity, it was found that the five active metals were significantly more active with aluminum being the most active of all the active metals. In applying the active metal to the semiconductor wafer, the wafer is first chemically polished and oxidized initially in a dry atmosphere for approximately fifteen minutes, then in a wet atmosphere for a period of approximately ninety minutes and then in a dry atmosphere for a period of approximately sixty minutes at a temperature of approximately 975° C. The active metal that was applied to the oxide layer 14 had a thickness in the range of 4,000 to 6,000 angstroms. The thickness of the oxide layer 14 should range between approximately 50 angstroms to below 10,000 angstroms. Typically, the oxide layer 14 had a thickness of 8,000 angstroms for the results provided by Tables I and II. The dimensions of the semiconductor wafer was approximately 25,000$\mu$ by 20,000$\mu$. The thickness of the semiconductor wafer was approximately 25$\mu$.

The following Table III indicates that the conductive channel current can be reduced by low temperature heat treatment:

TABLE III

| | Channel current in ma. |
|---|---|
| No treatment | $10^{-5}$ |
| 500° C., 15 minutes | 10 |
| 300° C., 15 minutes | 8.5 |
| 300° C., 4 hours | 1.5 |
| 300° C., 100 hours | 0.7 |
| 300° C., 500 hours | 0.1 |
| 300° C., 1000 hours | 0.1 |

In the above table, aluminum was the active metal used. The time necessary for returning the surface conductivity to its original value, before it was converted by the heat treatment process, is significantly greater at the lower 300° C. temperature. Hence, the reduction of a converted semiconductor surface is achieved by heat treatment for a sufficient period of time at a lower temperature.

While a nitrogen ambient was generally used during the heat treatment process, it was found that a mixture of 90 percent nitrogen and 10 percent hydrogen was particularly effective in converting the surface conductivity at lower temperatures. However, in using aluminum as the active metal, it was found that the heat treatment process could be carried out in almost any type of environment including an evacuated furnace. Aluminum or any other of the active metals could be evaporated, sputtered, or otherwise deposited onto the insulated layer 14.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for controlling the surface conductivity of a semiconductor surface in contact with an insulating layer comprising the steps of:
   - applying an active metal to the surface of said insulating layer;
   - said active metal being capable of a surface reaction with said insulating layer; and
   - heating for a period of time and at a temperature sufficient to vary the surface conductivity of said semiconductor surface.

2. A method for controlling the surface conductivity of a semiconductor surface in contact with an insulating layer comprising the steps of:

depositing a layer of an active metal selected from the group consisting of aluminum, chromium, magnesium, titanium and silicon on the surface of said insulating layer; and heating for a period of time and at a temperature sufficient to vary the surface conductivity of said semiconductor surface.

3. A method for controlling the surface conductivity of a body of silicon comprising the steps of:

growing a layer of silicon dioxide on the surface of said silicon body;

depositing a layer of an active metal selected from the group consisting of aluminum, chromium, magnesium, titanium, and silicon on the surface of said silicon dioxide layer; and heating said body of silicon for a period of time and at a temperature sufficient to vary the surface conductivity thereof.

4. A method for controlling the surface conductivity of a silicon semiconductor device comprising the steps of:

growing a silicon dioxide layer on the surface of said silicon semiconductor device;

depositing an active metal selected from the group consisting of aluminum, magnesium, titanium, chromium and silicon on the surface of said silicon dioxide layer; and heating said silicon semiconductor device for a period of time and at a temperature in the range of between 300° to 700° C. to vary the surface conductivity of said silicon semiconductor device.

5. A method for controlling the surface conductivity of a silicon semiconductor device having a region of P-type conductivity comprising the steps of:

growing a silicon dioxide layer on the surface of said silicon semiconductor device;

depositing an active metal selected from the group consisting of aluminum, magnesium, titanium, chromium and silicon on the surface of said silicon dioxide layer, said active metal having a length sufficient to cover the P-type region; and heating said silicon semiconductor device for a period of at least approximately 15 minutes in a nitrogen atmosphere at a temperature in the range of between 400° to 600° C. to increase the surface conductivity of said P-type region.

6. A method for controlling the surface conductivity of a silicon semiconductor device having a region of P-type conductivity comprising the steps of:

growing a silicon dioxide layer between about 50 and 10,000 Angstrom units thick on the surface of said silicon semiconductor device;

depositing an active metal layer between about 4,000 and 6,000 Angstrom units thick selected from the group consisting of aluminum, magnesium, titanium, chromium, and silicon on the surface of said silicon dioxide layer, said active metal layer having a length sufficient to cover the P-type region; and heating said silicon semiconductor device for a period of at least approximately 15 minutes in a nitrogen atmosphere at a temperature in the range of between 400° to 600° C. to increase the surface conductivity of of said P-type region and convert the surface portion of said P-type region to N-type conductivity.

7. A method for controlling the surface conductivity of a silicon semiconductor device having a region of P-type conductivity comprising the steps of:

growing a silicon dioxide layer on the surface of said silicon semiconductor device;

depositing a layer of aluminum on the surface of said silicon dioxide layer, said layer of aluminum having a length sufficient to cover the P-type region; and heating said layer of aluminum for a period of time and at a temperature sufficient to vary the surface conductivity of said silicon semiconductor device.

8. A method for converting the N-type surface portion of a region of P-type conductivity in a body of silicon comprising the steps of:

depositing an active metal selected from the group consisting of aluminum, magnesium, titanium, chromium and silicon on the surface of a silicon dioxide layer formed over said region of P-type conductivity, said active metal having a length sufficient to cover the P-type region; and heating said silicon body for a period of at least approximately 15 minutes in a suitable atmosphere at a temperature above 600° C. to convert the N-type surface conductivity of said P-type region to P-type conductivity.

9. A method for reducing N-type surface conductivity of a region of P-type conductivity in a body of silicon comprising the steps of:

depositing a layer of aluminum on the surface of a silicon dioxide layer formed over said region of P-type conductivity, said layer of aluminum having a length sufficient to cover the P-type region; and heating said silicon body for a period of time in a suitable atmosphere at a temperature of about 300° C. to reduce the surface conductivity of said P-type region.

10. A semiconductor device comprising:

a semiconductor body;

an insulating layer on the surface of said body;

an active metal layer on the surface of said insulating layer opposite to that of said body;

said active metal being capable of a surface reaction with said insulating layer; and a current conductive region in the said body substantially only under the said active metal layer.

11. The semiconductor device of claim 10 wherein the said body is silicon and said insulating layer is silicon dioxide.

12. The semiconductor device of claim 10 wherein the said active metal layer is selected from the group consisting of aluminum, magnesium, titanium, chromium and silicon.

References Cited

UNITED STATES PATENTS

| | | | |
|---|---|---|---|
| 3,226,612 | 12/1965 | Haenichen | 148—33.3 |
| 3,287,186 | 11/1966 | Minton et al. | 148—33.3 |

RICHARD O. DEAN, *Primary Examiner.*